United States Patent [19]

Colborn et al.

[11] Patent Number: 5,089,343

[45] Date of Patent: Feb. 18, 1992

[54] CURABLE DIELECTRIC POLYPHENYLENE ETHER-POLYEPOXIDE COMPOSITIONS

[75] Inventors: Robert E. Colborn; James R. Presley, both of Schenectady, N.Y.

[73] Assignee: General Electric Company, Schenectady, N.Y.

[21] Appl. No.: 389,215

[22] Filed: Aug. 3, 1989

[51] Int. Cl.$^5$ .................... B32B 15/08; B32B 17/10; B32B 27/38

[52] U.S. Cl. .................................... 428/416; 428/195; 428/290; 428/384; 428/413; 428/415; 428/432; 428/436; 428/457; 428/460; 428/469; 428/542.8; 428/901; 428/913

[58] Field of Search .............. 428/384, 457, 901, 469, 428/195, 288, 214, 413, 415, 416, 290, 432, 436, 460

[56] References Cited

U.S. PATENT DOCUMENTS

| | | |
|---|---|---|
| 3,257,357 | 6/1966 | Stamatoff . |
| 3,257,358 | 6/1966 | Stamatoff . |
| 3,306,874 | 2/1967 | Hay . |
| 3,306,875 | 2/1967 | Hay . |
| 3,367,978 | 2/1968 | White . |
| 3,914,266 | 10/1975 | Hay . |
| 4,028,341 | 6/1977 | Hay . |
| 4,054,553 | 10/1978 | Olander . |
| 4,066,625 | 1/1978 | Bolger . |
| 4,092,294 | 5/1978 | Bennett, Jr. et al. . |
| 4,234,706 | 11/1980 | White . |
| 4,431,779 | 2/1984 | White et al. . |
| 4,477,649 | 10/1984 | Mobley . |
| 4,477,651 | 10/1984 | White et al. . |
| 4,482,697 | 11/1984 | Haitko . |
| 4,517,341 | 5/1985 | White . |
| 4,521,584 | 6/1985 | Heitz et al. . |
| 4,853,423 | 8/1989 | Walles et al. . |

FOREIGN PATENT DOCUMENTS 49-107100 10/1974 Japan .

OTHER PUBLICATIONS

Article-Quaternary Phosphonium Compounds as Latent Accelerators for Anhydride-Cured Epoxy Resins I. Latency and Cure Characteristics, J. D. B. Smith-Journal of Applied Polymer Science 1385-1396(1979).

Article-Mechanism of Imidazole Catalysis in the Curing of Epoxy Resins, F. Ricciardi, WA Romanchick and MM Joullie-Journal of Polymer Science, Polymer Chemistry Edition vol. 21, 1475-1490 (1983) John Wiley & Sons, Inc.

Article-A Comparison of Some Imidazole Catalysts as Epoxy Curing Agents, Thomas J. Dearlove-Journal of Applied Polymer Science vol. 14, 1615-1626 (1970)-John Wiley & Sons, Inc.

White et al., J. Org. Chem. 34, 297-303 (1969).

Berger and Lohse, J. Appl. Poly. Sci. 30,531 (1985).

Application Ser. No. 288,214, filed Sep. 6, 1988.

*Primary Examiner*—Jacob Ziegler
*Attorney, Agent, or Firm*—Sudhir G. Deshmukh; James C. Davis, Jr.; William H. Pittman

[57] ABSTRACT

Curable polyphenylene ether-polyepoxide compositions containing 1-methylimidazole as the primary curing catalyst have improved latency properties and are useful in the preparation of laminates and bonding sheets for printed circuit boards.

39 Claims, No Drawings

CURABLE DIELECTRIC POLYPHENYLENE ETHER-POLYEPOXIDE COMPOSITIONS

This invention relates to curable dielectric polyphenylene ether-polyepoxide compositions. More particularly, it relates to curable dielectric polyphenylene ether-polyepoxide compositions having improved latency and containing 1-methylimidazole as a curing catalyst.

Polyphenylene ether-polyepoxide compositions having favorable dielectric properties are known. Many of these compositions undergo cure to form materials with high dielectric constants and other properties favorable for their use, for example, as copper-clad laminates suitable for etching to form printed circuit boards.

In addition to laminates, curable polyphenylene ether-polyepoxide compositions are useful for preparing bonding sheets for printed circuit boards. Bonding sheets are used when a multilayer structure is desired, involving etching of numerous printed circuits followed by their lamination into a single unit. For this purpose, a fiber-reinforced resinous bonding sheet is used to separate the etched copper circuitry on two successive circuit boards, with the desired connections being made through the bonding sheet. The bonding sheet composition must generally have a relatively high resin loading, since the resin must completely fill the voids created during the etching of circuits in the printed circuit boards. Extended cure time is also necessary, in order that the required flow may be achieved before curing is initiated. The formulation must be compatible with the base material in the circuit board. Flexibility is also preferred in a bonding sheet, unlike laminates for circuit boards in which stiffness is required. Finally, bonding sheet resin compositions must have a substantially higher flow rate when melted under low pressure than a composition used in circuit board manufacture, to facilitate filling of the aforementioned voids.

U.S. Pat. No. 4,853,423 discloses curable polyphenylene ether-polyepoxide compositions useful for laminate and circuit board production, wherein the compositions incorporate partially cured ("upstaged") products prepared from halogen-free bisphenol polyglycidyl ethers, halogen-free epoxidized novolaks, bisphenols containing bromine as aryl substituents, and at least one imidazole or arylene polyamine as a curing agent. The imidazole used as the curing agent is selected for its ability to effect rapid cure of the resinous composition after solvent removal. Imidazoles which are particularly useful therein are imidazole, 1,2-dimethylimidazole, 2-methylimidazole, 2-heptadecylimidazole, and 1-(2-cyanoethyl)-2-phenylimidazole. These compositions are highly solder resistant, solvent resistant and flame retardant and have excellent dielectric properties and dimensional stability at high temperatures. Furthermore, these compositions have a relatively short curing time. Cured materials prepared therefrom have utility for laminate and circuit board production.

Copending, commonly owned application Ser. No. 288,214, filed Dec. 22, 1988 discloses curable polyphenylene ether-polyepoxide compositions useful for bonding sheet manufacture as well as laminate and circuit board production, wherein the composition contains an imidazole as a curing catalyst. The imidazoles particularly useful in the above-cited application are also preferred for the composition described in this reference.

Although the compositions described in the above-cited references have excellent properties, it is desirable to provide resinous compositions having improved latency.

An improvement in the latency of the curable composition is desirable because it provides better flow of the resin and greater latitude in processing prior to lamination. Although less important in board manufacture, improved resin flow is crucial for prepregs to be applied as bonding sheets for a multilayer circuit board. However, it is also desirable to obtain enhanced latency without sacrificing rapid cure speed or other desirable properties required for use of the resin compositions in printed circuit board applications.

The present invention is based on the discovery that the use of 1-methylimidazole as a curing catalyst for polyphenylene ether-polyepoxide blends such as those described in the references cited above provides such blends with substantially greater latency than the use of other imidazoles, for example, imidazole, 2-methylimidazole, and 1,2-dimethylimidazole, without loss of cure speed or other beneficial properties.

The use of curing accelerators containing imidazoles to improve the latency of epoxy resin compositions is known in the art.

For example, Japanese Kokai 49/107100 discloses a latent effective curing accelerator for an epoxy resin composition wherein the accelerator is an alcohol solution containing an adduct derived from an organic acid metal salt and an imidazole or imidazole derivative. Examples provided therein of suitable imidazoles include methylimidazole, ethylimidazole, dimethylimidazole, 2-ethyl-4-methylimidazole, and methylethylimidazole. 1-Methylimidazoles are not mentioned therein.

U.S. Pat. No. 4,066,625 discloses an epoxy resin containing the reaction product of an epoxy resin and an imidazole compound as a curing agent. In the presence of this curing agent, the epoxy resin underwent a rapid, uniform cure at relatively low temperatures while remaining strongly resistant to gelling over a long period of time. 1-substituted imidazoles, e.g., 1-methylimidazole, were found to be inoperable in the epoxy composition and were expressly excluded from the scope of the invention.

In the article, "Polymerization of p-Cresyl Glycidyl Ether Catalyzed by Imidazoles I. The Influence of the Imidazole Concentration, the Reaction Temperature, and the Presence of Isopropanol on the Polymerization", J. Berger and F. Lohse, *J. Appl. Poly. Sci.*, 30, 531 (1985), it is reported that the polymerization of p-cresol glycidyl ether (CGE) catalyzed by 1-methylimidazole accelerates after an initial period, indicating latency behavior, while the polymerization catalyzed by 2-ethyl, 4-methylimidazole, while faster, did not show such behavior. The authors suggest that the differences in behavior between the two imidazoles might be due to the presence or absence of a secondary nitrogen on the imidazole. However, such a factor does not explain the substantial improvement in the latency of a curable polyphenylene ether-polyepoxide blend resulting from the use of 1-methylimidazole compared to the use of 1,2-dimethylimidazole, as shown in the examples below.

SUMMARY OF THE INVENTION

The present invention provides a curable polyphenylene ether-polyepoxide composition having improved latency and comprising:

(I) about 20 to about 80% of at least one polyphenylene ether, (II) about 80 to about 20% of at least one polyepoxide compound, and (III) a catalytically effective amount of 1-methylimidazole.

the composition being dissolved in an effective amount of an inert organic solvent.

When used to impregnate suitable fibrous reinforcing materials such as glass fiber cloth, the compositions provided in this invention furnish workable prepregs. As used herein, "prepreg" means a curable article comprising a substrate impregnated with an uncured or partially cured resinous material These compositions are readily soluble in organic solvents, facilitating impregnation.

In preferred embodiments, the composition of the present invention further contains various constituents, for example, co-catalysts and flame retardants, which improve such properties as the solvent resistance, solderability, and flame retardancy of the blends. The cured materials prepared from such compositions are consequently solder resistant, solvent resistant, and flame retardant, and have excellent dielectric properties and dimensional stability at high temperatures, making these compositions particularly useful for manufacturing laminates and bonding sheets for printed circuit boards.

DETAILED DESCRIPTION OF THE INVENTION

The invention is directed to curable polyphenylene ether-polyepoxide compositions having improved latency and containing 1-methylimidazole as a primary curing catalyst The polyphenylene ethers useful as component (I) in the composition of the present invention and methods for their preparation are known in the art and are disclosed, for example, in U.S. Pat. No. 4,431,779 to White et al, U.S. Pat. No. 3,306,874 and 3,306,875 to Hay and U.S. Pat. No. 3,257,357 and 3,257,358 to Stamatoff, all of which are incorporated herein by reference in their entirety.

Suitable polyphenylene ethers comprise structural units having the formula

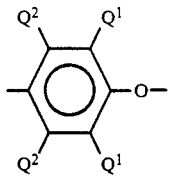

In each of these units independently, each $Q^1$ is independently halo9en,., primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$ Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched Most often, each $Q^1$ is alkyl or phenyl, especially $C_{1-4}$ alkyl, and each $Q^2$ is hydrogen Both homopolymer and copolymer polyphenylene ethers are included. Suitable homopolymers are those containing, for example, 2,6-dimethyl-1,4-phenylene ether units. Suitable copolymers include random copolymers containing such units in combination with ,for example, 2,3,6-trimethyl-1,4-phenylene ether units. Many suitable random copolymers, as well as homopolymers, are disclosed in the patent literature.

Also included are polyphenylene ethers containing moieties which modify properties such as molecular weight, melt viscosity and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles and formals.

The polyphenylene ethers are typically prepared by the known oxidative coupling of at least one corresponding monohydroxyaromatic compound. Particularly useful and readily available monohydroxyaromatic compounds are 2,6-xylenol (wherein each $Q^1$ and one $Q^2$ is methyl and the other $Q^2$ is hydrogen), whereupon the polymer may be characterized as a poly(2,6-dimethyl-1,4-phenylene ether), and 2,3,6-trimethylphenol (wherein each $Q^1$ and one $Q^2$ are methyl and the other $Q^2$ is hydrogen).

Other particularly useful polyphenylene ethers for the purposes of this invention are those which comprise molecules having aminoalkyl-substituted end groups, such as those described, for example, in U.S. Pat. No. 4,853,423 which is incorporated by reference herein. Such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

A variety of catalyst systems are known for the preparation of polyphenylene ethers by oxidative coupling. There is no particular limitation as to catalyst choice and any of the known catalysts can be used. For the most part, they contain at least one heavy metal compound such as a copper, manganese or cobalt compound, usually in combination with various other materials.

A first class of preferred catalyst systems consists of those containing a copper compound. Such catalysts are disclosed, for example, in U.S. Pat. Nos. 3,306,874, 3,306,875, 3,914,266 and 4,028,341. They are usually combinations of cuprous or cupric ions, halide (i.e., chloride, bromide or iodide) ions and at least one amine.

Catalyst systems containing manganese compounds constitute a second preferred class. They are generally alkaline systems in which divalent manganese is combined with such anions as halide, alkoxide or phenoxide.

Most often, the manganese is present as a complex with one or more complexing and/or chelating agents such as dialkylamines, alkanolamines, alkylenediamines, o-hydroxyaromatic aldehydes, o-hydroxyazo compounds, w-hydroxyoximes (monomeric and polymeric), o-hydroxyaryl oximes and b-diketones. Also useful are known cobalt-containing catalyst systems Suitable manganese and cobalt-containing catalyst systems for polyphenylene ether preparation are known in the art by reason of disclosure in numerous patents and publications.

Particularly useful polyphenylene ethers for the purposes of this invention are those which comprise molecules having at least one of the end groups of the formulas

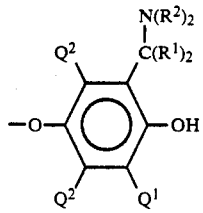

and

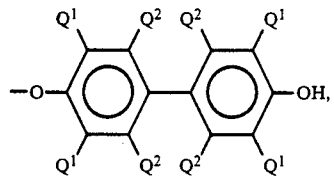

wherein $Q^1$ and $Q^2$ are as previously defined; each $R^1$ is independently hydrogen or alkyl, with the proviso that the total number of carbon atoms in both $R^1$ radicals is 6 or less; and each $R^2$ is independently hydrogen or a $C_{1-6}$ primary alkyl radical. Preferably, each $R^1$ is hydrogen and each $R^2$ is alkyl, especially methyl or n-butyl.

Polymers containing the aminoalkyl-substituted end groups of formula II may be obtained by incorporating an appropriate primary or secondary monoamine as one of the constituents of the oxidative coupling reaction mixture, especially when a copper- or manganese-containing catalyst is used. Such amines, especially the dialkylamines and preferably di-n-butylamine and dimethylamine, frequently become chemically bound to the polyphenylene ether, most often by replacing one of the α-hydrogen atoms on one or more $Q^1$ radicals. The principal site of reaction is the $Q^1$ radical adjacent to the hydroxy group on the terminal unit of the polymer chain. During further processing and/or blending, the aminoalkyl-substituted end groups may undergo various reactions, probably involving a quinone methide-type intermediate of the formula

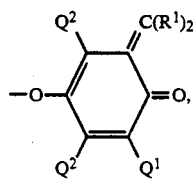

wherein $R^1$, $Q^1$ and $Q^2$ are as previously defined, with numerous beneficial effects often including an increase in impact strength and compatibilization with other blend components. Reference is made to U.S. Pat. Nos. 4,054,553, 4,092,294, 4,477,649, 4,477,651 and 4,517,341, the disclosures of which are incorporated by reference herein.

Polymers with 4-hydroxybiphenyl end groups of formula III are typically obtained from reaction mixtures in which a by-product diphenoquinone of the formula

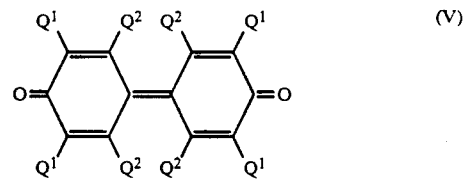

is present, especially in a copper-halide-secondary or tertiary amine system. In this regard, the disclosure of U.S. Pat. No. 4,447,649 is again pertinent as are those of U.S. Pat. Nos. 4,234,706 and 4,482,697, which are also incorporated by reference herein. In mixtures of this type, the diphenoquinone is ultimately incorporated into the polymer in substantial proportions, largely as an end group.

In many polyphenylene ethers obtained under the above-described conditions, a substantial proportion of the polymer molecules, typically constituting as much as about 90% by weight of the polymer, contain end groups having one or frequently both of formulas II and III. It should be understood, however, that other end groups may be present and that the invention in its broadest sense may not be dependent on the molecular structures of the polyphenylene ether end groups.

It will be apparent to those skilled in the art from the foregoing that apart from the molecular weight considerations dealt with hereinafter, the polyphenylene ethers contemplated for use in the present invention include all those presently known, irrespective of variations in structural units or ancillary chemical features.

For the purposes of this invention, the polyphenylene ether has a number average molecular weight within the range of about 3,000–40,000, preferably at least about 12,000 and most preferably at least about 15,000 and a weight average molecular weight within the range of about 20,000–80,000 as determined by gel permeation chromatography. Lower molecular weight materials produce curable compositions having superior flow characteristics which enable them to rapidly fill all voids in the etched printed circuit boards when employed as bonding sheets. The molecular weight is preferably in the range of about 5,000–10,000. Intrinsic viscosities of such polyphenylene ethers are preferably in the range of about 0 15–0.35 and most preferably about 0.16–0.30 dl./g., as measured in chloroform at 25° C.

Low molecular weight polyphenylene ethers of this type are not readily available as commercial products at present, and the preparation of such polymers especially for bonding sheet applications would be burdensome and expensive Therefore, it is preferred to prepare such low molecular weight polymers from commercially available polyphenylene ethers, typically having a number average molecular weight in the range of about 15,000–25,000. Such conversion can be conveniently achieved by redistribution reactions It is within the scope of the invention to perform the redistribution reaction in situ during preparation of the polyphenylene ether; reference is made, for example, to U.S. Pat. No. 4,521,584. However, subsequent redistribution is generally preferred, as described in U.S. Pat. Nos. 3,367,978 and 4,234,706 and in White et al., J. Org. Chem., 34, 297-303 (1969). For this purpose, a solution of the polyphenylene ether in a suitable solvent may be heated at a temperature in the range of about 50-110 C in the presence of a diphenoquinone such as,3,3',5,5'-tetramethyl-4,4'-diphenoquinone.

An alternative redistribution process involves reaction with a phenol in the presence of an oxidizing agent which is soluble in the reaction mixture, typically a diphenoquinone or an organic peroxide such as benzoyl peroxide. The preferred phenols for this purpose are bisphenols; that is, compounds containing two hydroxyphenyl groups attached to an aliphatic or cycloaliphatic moiety, which may also contain aromatic substituents.

For the most part, the suitable bisphenols have the formula $$HO-A^1-Y-A^2-OH \quad (VI)$$

wherein each of $A^1$ and $A^2$ is a monocyclic divalent aromatic radical and Y is a bridging radical in which one or two atoms separate $A^1$ from $A^2$. The $O-A^1$ and $A^2-O$ bonds in formula VI are usually in the meta or para positions of $A^1$ and $A^2$ in relation to Y.

The $A^1$ and $A^2$ values may be unsubstituted phenylene or substituted derivatives thereof, illustrative substituents (one or more) being alkyl, nitro, alkoxy and the like. Unsubstituted phenylene radicals are preferred. Each of $A^1$ and $A^2$ may, for example, be o- or m-phenylene and the other p-phenylene, but both are preferably p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and most preferably isopropylidene. Also included, however, are radicals which contain atoms other than carbon and hydrogen; for example, carbonyl, oxy, thio, sulfoxy and sulfone. An especially preferred bisphenol is bisphenol A in which $A^1$ and $A^2$ are each p-phenylene and Y is isopropylidene.

Redistribution by this method may be easily carried out immediately prior to incorporation of the polyepoxy compounds and other reagents described hereinafter to form the curable composition of the invention. The bisphenol and oxidizing agent are ordinarily employed in relatively small amounts, usually less than about 5% and most often about 0.5-3.0% by weight based on polyphenylene ether. The use of these small amounts results in the desired decrease in molecular weight of the polyphenylene ether, as opposed to its degradation into oligomers of much lower molecular weight as principally described in the publications cited hereinabove.

Redistributed polyphenylene ethers prepared by the action of bisphenols on polyphenylene ethers, as described hereinabove, are characterized by the formula

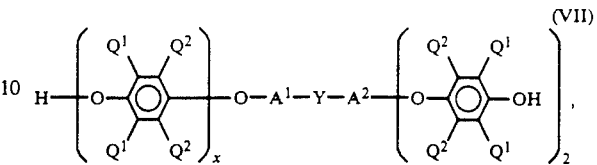

wherein $Q^{1-2}$, $A^{1-2}$ and Y are as previously defined, x is 0 or a positive number and z is a positive number. In most instances, $x+z$ is about 25-125; the value of x is most often 0.

Polyphenylene ethers which have undergone redistribution according to the methods discussed above will be referred to herein as "equilibrated polyphenylene ethers".

Component (II) comprises at least one polyepoxide compound. In its broadest sense, the invention includes the use of any such compounds known in the art. A variety of epoxy resins can be used, i.e. aliphatic and aromatic epoxides of variety molecular weights. The following are illustrative:

(1) Polyglycidyl ethers of bisphenols, especially bisphenol A.

(2) Epoxy novolaks of the formula

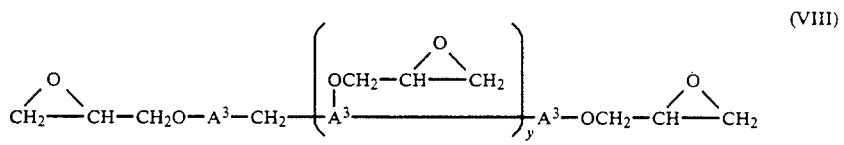

wherein each $A^3$ is an aromatic radical and y has an average value of at least about 0.1.

(3) Glycidyl adducts of amines and amides, illustrated by N,N-diglycidylaniline, N,N,N',N'-tetraglycidylxylylenediamine and triglycidyl isocyanurate.

(4) Glycidyl esters of carboxylic acids, such as diglycidyl phthalate and diglycidyl adipate.

(5) Polymers of unsaturated epoxides such as glycidyl acrylate, glycidyl methacrylate and allyl glycidyl ether.

(6) Polysiloxanes containing epoxy functionality, such as the diglycidyl ether of 1,3-bis(3-hydroxypropyl)tetramethyldisiloxane (7) Compounds prepared by epoxidation of dienes of polyenes, such as bis(2,3-epoxycyclopentyl) ether and vinylcyclohexene dioxide.

Preferably, component (II) is a polyepoxide composition containing chemically combined bromine in an amount effective to impart flame retardancy. Generally, this amount ranges from about 5 to about 50% and preferably is about 25%, based on the total amounts of components (I) and (II).

In a preferred embodiment, component (II) is a polyepoxide composition comprising at least one bisphenol polyglycidyl ether. It usually comprises a mixture of such ethers, part of the components of the mixture being halogen-free and the balance thereof containing bromine as aryl substituents. The total amount of bromine therein is usually about 5 to about 50% by weight Compounds of this type are prepared conventionally by the reaction of bisphenols with epichlorohydrin. "Bisphenol" as used herein refers to a compound containing two hydroxyphenyl groups attached to an aliphatic or cycloaliphatic moiety, which may also contain aromatic substituents Said compounds may be represented by the formula

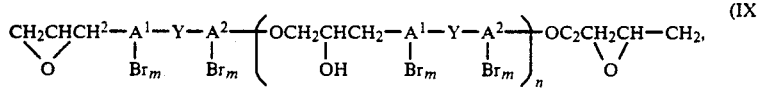
(IX)

wherein m is 0–4, n has an average value up to 1, $A^1$ and $A^2$ are as previously defined The $CH^2$-$A^1$ and $A^2$-0 bonds in formula IX are usually in the meta or para positions of $A^1$ and $A^2$ in relation to Y.

In most instances, this embodiment of component (II) comprises at least two bisphenol polyglycidyl ethers, one being brominated wherein m is 1–4 and preferably 2, and the other being bromine-free wherein m is 0. The preferred materials are commercially available reaction products of epichlorohydrin and 2,2-bis(4-hydroxyphenyl)propane (bisphenol A), including EPON 825 (n =0) and EPON 828 (n=about 0.14), available from Shell Chemical Co., and similar products prepared from epichlorohydrin and tetrabromobisphenol A. In a preferred version of this embodiment, the bromine-free epoxy resin is EPON 828 and the brominated resin is a brominated bisphenol A diglycidyl ether commercially available from Dow Chemical Company under the designation "Dow DER-542". The principal purpose of the brominated compounds is to provide flame retardancy.

The bisphenol polyglycidyl ethers of the above-described embodiment may be used alone or in combination with minor amounts of at least one of non-bisphenolic polyepoxy compounds, illustrated by alicyclic polyepoxy compounds such as 3,4-epoxy-cyclohexyl-methyl, 3,4-epoxycyclohexanecarboxylate, vinylcyclohexene dioxide, phenol-formaldehyde novolak polyglycidyl ethers corresponding to formula (VIII), resorcinol glycidyl ether, tetrakis (glycidyloxyphenyl)ethane, diglycidyl phthalate, diglycidyl tetrahydrophthalate and diglycidyl hexahydrophthalate. Epoxy tetrahydrophthalate and diglycidyl hexahydrophthalate. Epoxy novolaks of formula (VIII) are often preferred. Also present may be aryl monoglycidyl ethers such as the phenyl, α-naphthyl and β-naphthyl ethers and substituted derivatives thereof. When present, such non-bisphenol polyepoxy compounds and aryl monoglycidyl ethers will usually constitute up to about 30%, and typically about 15 to about 20% by weight of total epoxy compounds.

Another preferred embodiment of component (II) comprises the reaction product obtained by heating at a temperature in the range of about 125–225° C., in the presence of a catalytic amount of at least one basic reagent, a mixture comprising:

(A) at least one halogen-free bisphenol polyglycidyl ether having an average of at most one aliphatic hydroxy group per molecule; and (B) about 5 to about 40%, and preferably about 20 to about 30% of at least one bisphenol containing bromine as aryl substituents, the percentage of reagent (B) being by weight and based on the total amounts of reagents (A) and (B).

Reagent (A) in this embodiment of component (II) is at least one halogen-free bisphenol polyglycidyl ether of the type more fully described above. The materials which are preferred as Reagent (A) are commercially available reaction products of epichlorohydrin and 2,2-bis(4-hydroxyphenyl)propane (bisphenol A), including EPON 825 and EPON 828.

Reagent (B) is at least one bisphenol containing bromine in the form of substituents on the aromatic rings, usually a brominated derivative of bisphenol A. Its purpose according to the invention is principally to provide flame retardancy. Tetrabromobisphenol A is preferred as reagent (B), with 2,2-bis(3,5-dibromo-4-hydroxyphenyl)propane being most preferred because of its availability, relatively low cost and particular suitability for the purposes of the invention.

Optionally, the mixture of this embodiment may further contain (C) about 0 to about 30% of at least one halogen-free epoxidized novolak, the percentage being by weight and based on total amounts of Reagents (A), (B), and (C).

Suitable novolaks for use as precursors for reagent (C) are known in the art and include those described previously herein. They are typically prepared by the reaction of formaldehyde with a hydroxyaromatic compound such as phenol, which is often preferred, cresol or t-butylphenol. The novolak then undergoes reaction with an epoxy reagent such as epichlorohydrin to produce the resin useful as reagent (C).

Various epoxidized novolaks are commercially available, and any of them may be used according to the invention. It is usually strongly preferred that the epoxidized novolak contain substantially no free phenolic hydrogen atoms. A particularly preferred epoxy novolak for use in this invention is an epoxy novolak resin commercially available from Ciba-Geigy under the grade designation "EPN 1138".

As previously mentioned, reagent (B) comprises about 5 to about 40% and reagent (C), when present, about 0 to about 30% of the composition comprising component (II), with the balance being reagent (A).

Lower concentrations of reagent B or reagent C cause an unacceptable decrease in solvent resistance and/or flame resistance while an increase in reagent C may yield an incompatible material.

The mixture comprising reagents A, B and optionally C is heated, most often at a temperature in the range of about 125–225° C., preferably about 150–200° C. and most preferably about 160–190° C., in the presence of a catalytic amount of at least one basic reagent The mixture preferably consists essentially of said reagents; that is, they are the only ones contributing to the novel and essential properties thereof.

The triarylphosphines, especially triphenylphosphine, are the preferred basic reagents by reason of their effectiveness at low levels, low tendency to cause side reactions and harmlessness when they remain present after the reaction is complete. The proportion of catalyst is typically about 0.1–0.5% by weight. The reaction is preferably conducted in an inert atmosphere such as nitrogen, especially when a triarylphosphine is employed as catalyst. An inert organic solvent having a boiling point no higher than about.125° C., usually an aromatic hydrocarbon such as toluene, may be employed but usually provides no advantage at this point.

The structure of the resinous composition thus obtained is not fully known. It is believed to be an "upstaged" (i.e., partially cured) composition derived from the compounds of formula VIII, in which the brominated moieties form part of the molecular structure. The epoxidized novolak may also be chemically bound into the molecules of the upstaged composition in varying proportions.

Component (III) contains 1-methylimidazole, which is a commercially available imidazole. The 1-methylimidazole is present in a catalytically effective amount, which is that amount sufficient to improve latency while achieving rapid cure after solvent removal. Most often it provides at least 5 and preferably at least 20 milliequivalents of basic nitrogen per 100 parts of total curable composition, including any basic nitrogen present in the polyphenylene ether (mostly as aminoalkyl-substituted end groups) Thus, nitrogen is used the proportion of component (III) must be increased. In preferred embodiments, component (III) in addition contains a mixture of 1-methylimidazole and at least one aromatic polyamine or substituted guanidine compound The presence of either of these compounds improves solvent resistance. Preferred aromatic polyamines are those having a high degree of alkyl substitution on the aromatic ring, typically at least 3 such substituents The 3,5-diethyl-substituted 2,4- and 2,6-diaminotoluenes are generally the most preferred polyamines The polyamine should be present in the amount of about 60 to about 70% by weight based on the total amount of the polyamine and the 1-methylimidazole. Suitable substituted guanidine compounds for use in component (III) can be represented by the formula

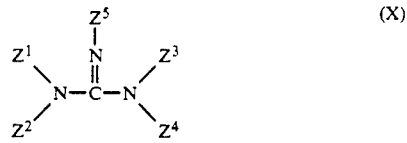

(X)

wherein $Z^1$ and $Z^3$ independently represent a lower alkyl group having about 1-4 carbon atoms, e.g., methyl, ethyl, and the like, or a substituted aromatic compound, e.g., tolyl, xylyl, and the like; and $Z^2$, $Z^4$, and $Z^5$ independently represent hydrogen or a lower alkyl group having about 1-4 carbon atoms, e.g., methyl, ethyl, and the like. The preferred guanidine compound represented by formula (X) above is di-otolylguanidine, represented by the following formula:

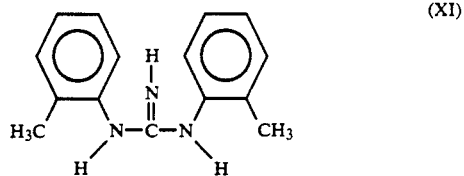

(XI)

The substituted guanidine compound should be present in component (III) in the amount of about 20 to about 80%, preferably 45-60%, by weight based on the total amount of the substituted guanidine and the 1-methylimidazole.

For the purpose of this invention, the equivalent weight of the 1-methylimidazole is equal to its molecular weight and that of a diamine is half its molecular weight, and that of a guanidine is half its molecular weight.

Various other materials may be used in the curable compositions of this invention, the presence of certain of them being preferred One of these is component (IV) is chemically combined zinc or aluminum, preferably zinc, furnished in the form of a salt which is soluble or stably dispersible in the curable composition. Salts of diketones in which one carbon atom separates the carbonyl groups, especially zinc acetylacetonate, and salts of fatty acids, especially stearates, are examples of suitable forms of zinc or aluminum for this purpose. In general, the fatty acid salts are preferred when component (III) contains alkylene polyamines, and diketone salts are preferred when component (III) is entirely 1-methylimidazole.

Under certain conditions, acetylacetonates, such as zinc acetylacetone can form a hydrate which readily loses acetylacetone and becomes insoluble in the organic systems used for laminate preparation. Therefore, it may be necessary to take steps to maintain the zinc or aluminum in stable dispersion.

One means for doing this is to subject the composition to continuous agitation; however, this is 30 generally not practical. A better method is to form an alcoholate of the acetylacetonate, as by reaction with methanol. The alcoholate loses alcohol rather than acetylacetone under similar conditions, remaining in solution or homogeneous suspension. acetylacetone under similar conditions, remaining in solution or homogeneous suspension.

Another method for maximizing homogeneity is to use a fatty acid salt. Still another method uses a titanium compound as a compatibilizer, as disclosed hereinafter.

Component (IV) is used in a cocatalytically effective amount, and generally serves to accelerate curing and improve solvent resistance, flame retardancy, and latency. About 2 to about 8%, and preferably about 4 to about 6%, of zinc or aluminum based on total curable composition, is usually present.

Another preferred material for use herein is (V) at least one epoxidized novolak, most often halogen-free. It is usually employed in the amount of about 3 to about 20% by weight based on the total curable composition excluding solvent. When component (II) is an upstaged composition, the epoxidized novolak is typically used in the amount of about 5 to about 20%, and preferably about 8 to about 10%, by weight based on the total curable composition excluding solvent. If component (II) is not an upstaged composition, the epoxidized novolak is generally used in the amount of about 3 to about 20%, and preferably about 4%, by weight based on the total curable composition excluding solvent.

Another material which is often preferred is (VI) at least one novolak, substantially all oxygen therein being in the form of phenolic hydroxy groups. It is also usually halogen-free. It serves as a hardener and accelerates curing, particularly in compositions to be used for circuit boards as opposed to bonding sheets. It is similar in molecular structure to the previously described epoxidized novolak except that it has not been epoxidized t-Butylphenol-formaldehyde novolaks are often preferred. The amount of said novolak is generally about 0 to about 20% by weight based on the total curable composition excluding solvent. The amount of novolak which should be used in the curable composition of this invention depends on whether component (I) is an equilibrated or non-equilibrated polyphenylene ether and whether component (II) is an upstaged or non-upstaged polyepoxide composition. If component (I) is an equilibrated polyphenylene ether and component (II) is an upstaged polyepoxide composition, the novolak is typically present in an amount ranging from 0 to about 3% by weight based on the total curable composition excluding solvent If component (I) is an equilibrated polyphenylene ether and component (II) is a non-upstaged polyepoxide composition, the novolak should generally be present at about 5 to about 10% by weight based on the total curable composition excluding solvent. If component (I) is a non-equilibrated polyphenylene ether and component (II) is an upstaged polyepoxide composition, the novolak is typically used in the amount of about 5 to about 10% by weight based on the total curable composition excluding solvent. If component (I) is a non-equilibrated polyphenylene ether and component (II) is a non-upstaged polyepoxide composition, the novolak is typically used in the amount of about 10 to about 20% by weight based on the total curable composition excluding solvent.

The curable compositions of the invention are dissolved in an effective amount of an inert organic solvent, typically to a solute content of about 25 to about 60%, preferably about 45 to about 52%, by weight. The identity of the solvent is not critical, provided it may be removed by suitable means such as evaporation. Aromatic hydrocarbons, especially toluene, are preferred The order of blending and dissolution is also not critical; however, in order to avoid premature curing, catalyst and hardener components should generally not be brought initially into contact with polyphenylene ether and polyepoxides at a temperature above about 60° C. Proportions of components and bromine herein do not include solvent.

Among the other materials which may be present are inert, particulate fillers such as talc, clay, mica, silica, alumina and calcium carbonate. In addition, the bromine content of the curable composition may be supplied in part by materials such as alkyl tetrabromophthalates and/or epichlorohydrin reaction products with mixtures of bisphenol A and tetrabromobisphenol A. The alkyl tetrabromophthalates also serve as plasticizers and flow improvers. Fabric wettability enhancers, chiefly polar liquids such as n-butyl alcohol, methyl ethyl ketone and tetrahydrofuran, may be advantageous under certain conditions. Such materials as antioxidants, thermal and ultraviolet stabilizers, lubricants, antistatic agents, dyes and pigments may also be present.

Another material which is preferred for use in the compositions of this invention is (VII) antimony oxide, which functions as a synergist for the bromine to provide flame retardancy. Antimony oxide must be maintained in stable dispersion. This may be done by agitation and/or combination with a suitable dispersing agent, of which many are known in the art. The proportion of antimony oxide is usually about 0 to about 5%, preferably about 3 to about 4%, by weight based on the total curable composition excluding solvent.

One preferred dispersing agent is a polymer which is compatible with the resinous constituents of the curable composition but is substantially non-reactive under the conditions employed, typically a polyester. More powerful dispersing agents, such as amines, may be required when component (IV) is a fatty acid salt, since such salts may otherwise form insoluble complexes with antimony pentoxide.

A material whose presence in minor amount may improve the solvent resistance and compatibility of the curable composition, and is therefore preferred, is at least one aliphatic tris(dialkylphosphato)titanate. Suitable phosphatotitanates are known in the art and commercially available. They may be represented by the formula

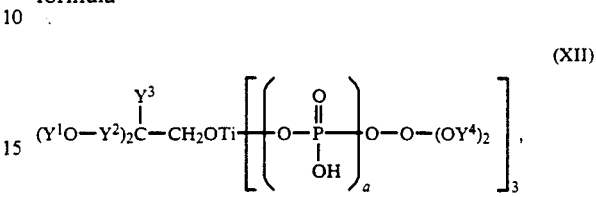

(XII)

wherein $Y^1$ is $C_{2-6}$ primary or secondary alkyl or alkenyl and preferably alkenyl, $Y^2$ is $C_{1-3}$ alkylene and preferably methylene, $Y^3$ is $C_{1-5}$ primary or secondary alkyl and a is from 0 to about 3 and is preferably 0 or 1. Most preferably, $Y^1$ is allyl, $Y^3$ is ethyl, $Y^4$ is octyl and a is 0. The phosphatotitanate is most often present in the amount of about 0 to about 1%, preferably about 0.4%, by weight based on the total amount of the curable composition excluding solvent.

The present invention includes all compositions which comprise the above-described constituents, including those containing other unspecified ingredients. However, the compositions which are often preferred consist essentially of components I-VI; that is, these components are the only ones which materially affect the basic and novel characteristics of the compositions.

Another aspect of the invention is prepregs comprising a fibrous substrate (woven or non-woven) such as glass, quartz, polyester, polyamide, polypropylene, cellulose, nylon or acrylic fibers, preferably glass, impregnated with the curable composition and obtained upon pressure. The resulting cured articles are other aspects of the invention.

Typically, 2- or 20-ply laminates are compression molded at temperatures in the range of about 200-250° C. and under pressures on the order of 20-60 kg./cm.$^2$ for about 1.5 to about 10 minutes. Laminates clad with a conductive metal such as copper, useful for printed circuit board production, may be so prepared and cured by art-recognized methods The metal cladding may then be conventionally patterned For use as bonding sheets, the prepregs are usually partially cured after preparation. Partial curing may be achieved by heating the curable composition at a temperature in the range of about 130° to about 175° C. for a period of about 1 to about 5 minutes The partially cured prepregs thus obtained may be easily handled and shipped.

In use, sheets are sandwiched between two printed circuit boards comprising metal-clad laminates into which circuits have been etched. The metal cladding is most often copper. A plurality of bonding sheets may be employed to provide multilayer structures. Curing is then completed at temperatures typically in the range of about 200 to about 250° C. and pressures in the range of about 0.1 to about 0.2 Kg./Cm$^2$.

Accordingly, another aspect of the invention is multilayer circuit assemblies comprising at least two printed circuit boards separated by a cured composition prepared from the above-described bonding sheets.

The preparation of the curable compositions, cured compositions and articles of this invention is illustrated by the following examples. All parts and percentages are by weight unless otherwise indicated.

The following materials were used in Examples 1–11:
The following materials were used in Examples 1–11:

Component (I) - a poly(2,6-dimethyl-1,4-phenylene ether) (PPO) having a number average molecular weight of about 20,000, an intrinsic viscosity in chloroform at 25° C. of 0.40 dl./g. and a nitrogen content of about 960 ppm.

Component (II) - a mixture of bisphenol A diglycidyl ether and the diglycidyl ether of tetrabromobisphenol A, commercially available from Dow Chemical Company under the designation "DER 542".

Component (III) - commercially available imidazoles - see Table I.

Component (IV) - zinc stearate.

Component (V) - an epoxy novolak resin commercially available from Ciba-Geigy under the grade designation "EPN 1138".

Component (VI) - a t-butylphenol novolak having an average molecular weight in the range of about 700–900, commercially available from Union Carbide Corp. under the designation "CK 2103".

Lica 12 - a commercially available compound of formula 11 wherein $R^1$ is allyl, $R^2$ is methylene, $R^3$ is ethyl, $R^4$ is octyl and x is 0.

The reaction mixtures in Examples 7–11 further contained a mixture of 3,5-diethyl-substituted 2,4- and 2,6-diaminotoluenes, referred to herein as Ethacure, and Examples 9–11 also contained antimony glycoxide ($Sb_2(OCH_2CH_2O)_3$).

Various imidazoles were used as component III in the examples, as indicated in Table I. 1-methylimidazole was used in Examples 6, 9 and 11.

EXAMPLES 1-6

A series of curable compositions were prepared by dissolving the following ingredients in the indicated amounts in toluene to a total solids concentration of 45%.

Component (I) - PPO, 50 parts
Component (II): 26 parts, DER 542,
24 parts, EPON 828
Component (III) - (various imidazoles) - 0.6-1.5 parts per 100 parts of components (I) and (II)
Component (IV) - zinc stearate, 7 parts per 100 parts of components (I) and (II)
Component (V) - EPN 1138, 4 parts per 100 parts of components (I) and (II)
Component (VI) - CK 2103, 11.5 parts per 100 parts of components (I) and (II)
Lica 12 - 0.5 part per 100 parts of components (I) and (II)

2000 ml of toluene were heated in a 5000 ml round bottom flask equipped with a mechanical stirrer. Generally, the zinc compound was dissolved first, followed immediately by the polyphenylene oxide. Subsequent addition of the epoxy resins was followed by the Lica 12. The imidazole was added last. The resin mixture was placed on a glass cloth using a treater, with the speed of the treater adjusted to obtain approximately 42% resin loading on the cloth. The resulting prepreg was dried at 160° C. for 1 minute. Seven layers of the prepreg were then compressed under pressure at 240° C. for 4 minutes to form laminates.

The resulting laminates were examined for latency and glass transition temperatures, the results of which are provided in Table I below.

EXAMPLES 7-8

The procedures followed in Examples 1, 3, and 6 were repeated except that Ethacure was added to the reaction mixtures. The results are presented in Table I.

EXAMPLES 10-11

The procedures followed in Examples 8 and 9 were followed except that antimony glycoxide was added to the reaction mixtures. The antimony oxide was added to the reaction mixture after addition of the Lica 12 and prior to the addition of the imidazole. The antimony compounds typically formed a slurry in the solution. The results are shown in Table I.

In Table I below, the amount of heat evolved by the samples was measured by differential scanning calorimetry (DSC) using a heating rate of 20° C./minute. Glass transition temperatures (Tgs) were measured using a Rheometrics Dynamic Mechanical Analyzer on samples cured for 4.5 minutes at 240° C.

TABLE I

| Comparison of Imidazoles | | | | |
|---|---|---|---|---|
| Example # | Imidazole | Weight[a] | DSC | Tgs (°C.) |
| 1 | 1-cyanoethyl-2-phenylimidazole | 1.5 | 183 | 215 |
| 2 | 2-phenylimidazole | 1.1 | 184 | 209 |
| 3 | 1,2-dimethyl-imidazole | 0.73 | 189 | 199 |
| 4 | 2-methylimidazole | 0.63 | 192 | 211 |
| 5 | 2-ethylimidazole | 0.73 | 192 | 207 |
| 6 | 1-methylimidazole | 0.63 | 216 | 211 |
| 7 | 1-cyanoethyl-2-phenylimidazole | 1.5 | 178 | 211 |
| 8 | 1,2-dimethyl-imidazole | 0.73 | 186 | 209 |
| 9 | 1-methylimidazole | 0.63 | 209 | 217 |
| 10 | 1,2-dimethyl-imidazole | 0.73 | 203 | 221 |
| 11 | 1-methylimidazole | 0.63 | 219 | 221 |

[a]measured in parts per 100 parts of components (I) and (II).

The data in Table I above indicates that the 1-methylimidazole clearly demonstrates the most latency, as measured by the differential scanning calorimetry (DSC) peak exotherms, even when compared to imidazoles containing deactivating electronic groups such as the 2-phenyl and 1-cyanoethyl-2-phenyl substituents. Moreover, the cure properties of the composition containing 1-methylimidazole, as evidenced by the glass transition temperatures, do not suffer in comparison with those containing the other imidazoles.

Examples 12–29 illustrate other properties of laminates prepared from a variety of different resin systems containing 1-methylimidazole as the primary catalyst. The glass transition temperature, solderability and solvent resistance values are provided in Table II.

EXAMPLES 12-19

Curable compositions were prepared by dissolution of the following ingredients in the indicated amounts in toluene to a total solids concentration of 45%:

Component I - PPO, 39.7%
Component II: 18.9% DER-542; 20.7% EPON 828
Component III - 1-methylimidazole, 0.52%
Component IV - zinc octoate, 3.2%
Component V - EPN 1138, 3.2%

Component VI - CK 2103, 9.1%
Lica 12 - 0.4%
Ethacure - 1.0%
EFR[6] - a commercially available form of antimony pentoxide supplied by Nyacol, "dried" EFR[6] meaning that the powder has been dried overnight in an oven heated to 220° C., 3.2%
Solsperse - a commercially available polyesteramine dispersant supplied by ICI used to keep antimony pentoxide dispersed in the resin, 0.1%.

The percentages listed above are based on the total curable composition.

The resin mixtures were placed on a glass cloth using a treater, the speed of the treater being adjusted to obtain approximately 41% resin loading on the cloth.

In Examples 16-19, the prepregs were dried in an oven at 150° C. for 1.5 minutes. Seven layers of the prepreg in Examples 12-19 were compressed under a pressure of about psi for varying lengths of time at about 250° C. to form laminates. The lengths of time at which the prepregs were compressed in these examples are as follows:

| Example No. | Time (minutes) |
| --- | --- |
| 12 | 1.5 |
| 13 | 2.5 |
| 14 | 4.5 |
| 15 | 8.5 |
| 16 | 1.5 |
| 17 | 4.5 |
| 18 | 10 |
| 19 | 10 |

EXAMPLES 20-24

Curable compositions were prepared by dissolution of the following ingredients in the indicated amounts in toluene to a total solids concentration of 50%

Component I - PPO, 40.6% (0.8%,0.8%), the percent figures in parenthesis refer to the degree of equilibration/degradation of the polyphenylene oxide induced by weight percent of benzoyl peroxide and bisphenol A
Component II- 40.6% - an upstaged epoxy resin obtained by reacting tetrabromobisphenol A with Epon 828 and the epoxy phenyl novolak EPN 1138 having an average functionality of 3.5
Component III - 1-methylimidazole, 1.0%
Component IV - zinc octoate, 3.4%
Component V - EPN 1138, 8.2%
Component VI - CK 2103, 0%
Lica 12 - 0.4%
Ethacure - 1.0%
EFR[6] - 3.2%

The resin mixture was placed on a glass cloth using a treater at a speed sufficient to obtain an approximate resin loading of 44% in the cloth.

The prepregs formed in Examples 20-23 were dried in an oven at 160° C. for 1.5 minutes while the prepreg of Example was dried at 160° C. for 2 minutes. The prepregs were then compressed under the conditions described in Examples 12-19 above except that the compression times were as follows:

| Example No. | Time (minutes) |
| --- | --- |
| 20 | 1.5 |
| 21 | 2.5 |

| Example No. | Time (minutes) |
| --- | --- |
| 22 | 4.5 |
| 23 | 8.5 |
| 24 | 1.5 |

EXAMPLES 25-29

Curable compositions were prepared by dissolution of the following ingredients in the indicated amounts in toluene to a total solids concentration of 48%.

Component I - PPO, 41.6% (0.4%, 0.4%)
Component II- 41.6%, an upstaged epoxy resin obtained by reacting tetrabromobisphenol A with EPON 828.
Component III - 1-methylimidazole, 0.7%
Component IV - zinc octoate, 5.6%
Component V - EPN 1138, 8.3%
Component VI - CK 2103, 0%
Lica 12 - 0.4%
Ethacure - 1.1%
Dried EFR[6] - 0%
Solsperse - 0%

The resin mixture was placed on a glass cloth using a treater, the speed of the treater being adjusted to obtain approximately 38-40% resin loading on the cloth.

The prepregs prepared in these examples were all dried in an oven at 160° C. for 3 minutes. The prepregs were compressed under the conditions recited in Examples 12-19 for the following lengths of time:

| Example No. | Time (minutes) |
| --- | --- |
| 25 | 1.5 |
| 26 | 3.5 |
| 27 | 5.5 |
| 28 | 10.5 |
| 29 | 3.5 |

A larger laminate, i.e., 10×10, was prepared in Example 29, requiring the use of larger press, i.e., a Wabash press.

In Table II, solderability is indicated by the percent expansion of the laminate after immersion for 30 seconds in a solder bath heated to 288° C. The lower the percent increase in thickness, the greater the solderability. Solvent resistance is measured by the percent weight change of a laminate after immersion for 30 minutes in methylene chloride followed by drying under ambient conditions for 10 minutes. Any eventual weight loss (dissolution of the material) is also included in this value. The smaller the weight loss, the better the solvent resistance. Flammability of the laminate is evidenced by the UL-94 rating and flameout time (FOT). A V-1 rating, as determined by Underwriters Laboratories test procedure UL-94, is universally required with V-0 usually being necessary. The V-0 rating requires a FOT of not more than 10 seconds in any trial and a cumulative FOT of not more than 50 seconds for five samples. As a practical matter, a maximum cumulative FOT of 35 seconds is often mandated by purchasers

TABLE II

| Example No. | Tg (°C.) | Solderability (%) | Solvent Resistance (%) | UL-94 Rating | FOT (seconds) |
| --- | --- | --- | --- | --- | --- |
| 12 | — | 0.0 | 3.1 | — | — |
| 13 | — | 0.0 | 3.3 | — | — |

TABLE II-continued

| Example No. | Tg (°C.) | Solderability (%) | Solvent Resistance (%) | UL-94 Rating | FOT (seconds) |
|---|---|---|---|---|---|
| 14 | — | −1.5 | 2.7 | — | — |
| 15 | — | 0.0 | 3.5 | — | — |
| 16 | 213 | −1.4 | 3.0 | V-1 | 6.14 |
| 17 | — | 0.7 | 2.0 | V-1 | 6.75 |
| 18 | — | −0.7 | 2.3 | V-0 | 2.72 |
| 19 | 213 | — | — | V-1 | 5.71 |
| 20 | 191 | 0 | 1.5 (1.5)[a] | — | — |
| 21 | — | 0 | 1.6 (1.6)[a] | — | — |
| 22 | 189 | 0 | 2 (2)[a] | — | — |
| 23 | — | 0 | — | — | — |
| 24 | 197 | 0 | — | — | — |
| 25 | 213 | 0[b] | −1.8 | — | — |
| 26 | 209 | 0.7 | 2.1 | — | — |
| 27 | 207 | 0.0 | 2.6 | — | — |
| 28 | 207 | 0.0 | 2.6 | — | — |
| 29 | 203 | 15.3 | 1.8 | V-1 | 14.2 |

[a]Refers to eventual weight loss (dissolution of the material).
[b]Blister formed on the surface of the laminate It is apparent from the data set forth in Table II that 1-methylimidazole, while enhancing latency as indicated in Table I above, has no deleterious effect on the resins, and provides laminates having excellent properties.

While the present invention has been described with reference to particular embodiments thereof, it will be understood that numerous modifications may be made by those skilled in the art without actually departing from the spirit and scope of the invention as defined in the appended claims.

What is claimed is:

1. A curable article comprising a fibrous substrate impregnated with a curable polyphenylene ether-polyepoxide composition comprising:
   (I) about 20 to about 80% of at least one polyphenylene ether;
   (II) about 80 to about 20% of at least one polyepoxide compound;
   (III) a catalytically effective amount of 1-methylimidazole; and
   (IV) a cocatalytically effective amount of zinc or aluminum in the form of a salt.

2. The curable article according to claim 1 wherein component I is a poly(2,6-dimethyl-1,4-phenylene ether) having a number average molecular weight within the range of about 3000–40,000.

3. The curable article according to claim 1 wherein component (II) contains chemically combined bromine in an amount effective to impart flame retardancy.

4. The curable article according to claim 3 wherein component (II) contains about 5 to about 50% by weight chemically combined bromine based on the total amounts of components (I) and (II).

5. The curable article according to claim 4 wherein component (II) comprises at least one bisphenol polyglycidyl ether having an average of at most one aliphatic hydroxy group per molecule, the composition containing about 5 to about 50% by weight bromine as aryl substituents, and comprising compounds having the formula

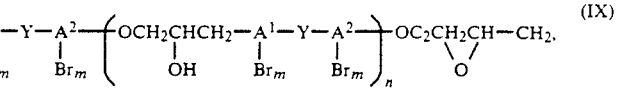

(IX)

wherein m is 0–4 and n has an average value up to 1, each of $A^1$ and $A^2$ is a monocyclic divalent aromatic radical and Y is a bridging radical in which one or two atoms separate $A^1$ from $A^2$.

6. The curable article according to claim 5 wherein $A^1$ and $A^2$ are both p-phenylene radicals, and Y is an isopropylidene radical.

7. The curable article according to claim 1 wherein component (II) comprises the reaction product obtained by heating at a temperature in the range of about 125–225° C., in the presence of a catalytic amount of at least one basic reagent, a mixture comprising:
   (A) at least one halogen-free bisphenol polyglycidyl ether having an average of at most one aliphatic hydroxy group per molecule; and
   (B) about 5 to about 40% of at least one bisphenol containing bromine as aryl substituents, the percentage of reagent (B) being by weight and based on the total amounts of reagents (A) and (B).

8. The curable article according to claim 7 wherein reagent (A) has the formula

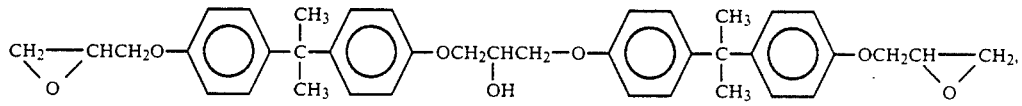

wherein n has an average value up to 1 and reagent (B) is tetrabromobisphenol A.

9. The curable article according to claim 8 wherein n is about 0.14 and reagent (B) is 2,2-bis(3,5-dibromo-4-hydroxyphenyl)propane.

10. The curable article according to claim 9 wherein the amount of reagent (B) is about 20 to about 30% by weight based on the total amounts of reagents (A) and (B).

11. The curable article according to claim 7 further comprising (C) about 0 to about 30% of at least one halogen-free epoxidized novolak, the percentage being by weight and based on total reagents (A), (B), and (C).

12. The curable article according to claim 11 wherein reagent (C) is a novolak prepared from formaldehyde, phenol, and epichlorohydrin.

13. The curable article according to claim 1 wherein component (III) is present in an amount sufficient to provide a total of at least 5 milliequivalents of basic nitrogen per 100 parts of the curable composition.

14. The curable article according to claim 13 wherein component (III) is present in an amount sufficient to provide a total of at least 20 milliequivalents of basic nitrogen per 100 parts of the curable composition.

15. The curable article according to claim 1 wherein component (III) further comprises at least one aromatic polyamine.

16. The curable article according to claim 15 wherein the aromatic polyamine is present in component (III) in the amount of about 60 to about 70% by weight based on the total amount of 1-methylimidazole and aromatic polyamine.

17. The curable article according to claim 16 wherein the aromatic polyamine is a 3,5-diethyl-substituted 2,4-diaminotoluene or a 3,5-diethyl-substituted 2,6-diaminotoluene or a mixture thereof.

18. The curable article according to claim 17 wherein component (III) further comprises a substituted guanidine compound having the formula

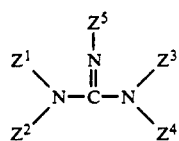
(X)

wherein $Z^1$ and $Z^3$ independently represent a lower alkyl group having about 1-4 carbon atoms or a substituted monovalent aromatic compound; and $Z^2$, $Z^4$ and $Z^5$ independently represent hydrogen or a lower alkyl group having about 1-carbon atoms.

19. The curable article according to claim 18 wherein the substituted guanidine compound is represented by the formula:

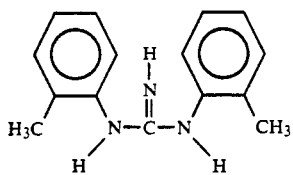
(XI)

20. The curable article according to claim 19 wherein the substituted guanidine compound is present in component (III) in the amount of about 20 to about 80% by weight based on the total amount of 1-methylimidazole and substituted guanidine compound.

21. The curable article according to claim 1 wherein zinc or aluminum salt of component (IV) is about 2 to about 8%, the salt being soluble or stably dispersible in the curable composition.

22. The curable article according to claim 1 wherein component (IV) is zinc acetylacetonate or zinc stearate.

23. The curable article according to claim 1 further comprising (V) at least one halogen-free novolak in the amount of about 3 to about 20% by weight based on the total curable composition.

24. The curable article according to claim 23 wherein component (V) is a novolak prepared from formaldehyde, phenol, and epichlorohydrin.

25. The curable article according to claim 1 further comprising (VI) at least one halogen-free novolak, substantially all oxygen therein being in the form of phenolic hydroxy groups, the novolak being present in the amount of about 0 to about 20% by weight based on the total curable composition.

26. The curable article according to claim 1 further comprising at least one aliphatic tris(dialkylphosphato)titanate of the formula

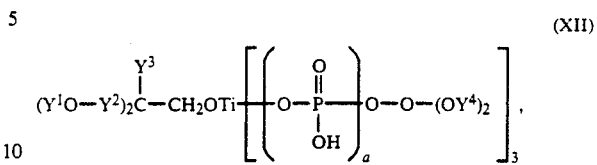
(XII)

wherein $Y^1$ is $C_{2-6}$ primary or secondarily alkyl or alkenyl, $Y^2$ is $C_{1-3}$ alkylene, $Y^3$ is $C_{1-5}$ primary or secondary alkyl, $Y^4$ is $C_{5-12}$ primary or secondary alkyl and a is from 0 to about 3, in the amount of about 0 to about 1% by weight based on the total curable composition.

27. The curable article according to claim 26 wherein $Y^1$ is alkyl, $Y^2$ is methyl, $Y^3$ is ethyl, $Y^4$ is octyl and a is 0 or 1.

28. The curable article according to claim 1 further comprising about 0 to about 5% of antimony oxide stably dispersed therein, the percentage being by weight and based on the total curable composition.

29. A curable article comprising a fibrous substrate impregnated with a curable polyphenylene-polyepoxide composition having improved latency and comprising:
(I) about 20 to about 80% of at least one polyphenylene ether;
(II) about 80 to about 20% of at least one polyepoxide compound;
(III) 1-methylimidazole in an amount sufficient to provide a total of at least 5 milliequivalents of basic nitrogen per 100 parts of said curable composition, said composition being dissolved in an effective amount of 1-methylimidazole; and
(IV) about 2 to about 8% of zinc in the form of a salt which is soluble or stably dispersible in said curable composition.

30. The article according to claim 1 wherein the substrate is glass fiber.

31. The article according to claim 29 wherein the substrate is glass fiber.

32. A cured article prepared by the application of heat and pressure to the article of claim 30.

33. A cured article prepared by the application of heat and pressure to the article of claim 31.

34. A printed circuit board plank comprising an article according to claim 32 clad with a conductive metal.

35. The printed circuit board blank according to claim 34 wherein the metal is copper.

36. A printed circuit board plank comprising an article according to claim 33 clad with a conductive metal.

37. The printed circuit board blank according to claim 36 wherein the metal is copper.

38. A multilayer circuit assembly comprising at least two printed circuit boards separated by a cured composition prepared by the application of heat and pressure to the article of claim 1.

39. A multilayer circuit assembly comprising at least two printed circuit boards separated by a cured composition prepared by the application of heat and pressure to the article of claim 29.

* * * * *